(12) United States Patent
Matsumura et al.

(10) Patent No.: US 7,772,697 B2
(45) Date of Patent: Aug. 10, 2010

(54) SEMICONDUCTOR DEVICE AND METHOD FOR PRODUCING THE SAME

(75) Inventors: Kazuhiko Matsumura, Nara (JP); Nozomi Shimoishizaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 12/075,359

(22) Filed: Mar. 11, 2008

(65) Prior Publication Data

US 2008/0164608 A1    Jul. 10, 2008

Related U.S. Application Data

(63) Continuation of application No. 11/405,060, filed on Apr. 17, 2006, now Pat. No. 7,382,050.

(30) Foreign Application Priority Data

Apr. 22, 2005 (JP) .............................. 2005-124346
Feb. 14, 2006 (JP) .............................. 2006-036929

(51) Int. Cl.
H01L 23/48    (2006.01)
(52) U.S. Cl. ................. 257/737; 257/741; 257/748; 257/773; 257/786; 257/E23.07; 257/E23.072
(58) Field of Classification Search ............... 257/737, 257/E23.07, 741, 748, 773, 786, E23.072
See application file for complete search history.

(56) References Cited

U.S. PATENT DOCUMENTS 6,280,828 B1 *  8/2001  Nakatsuka et al. .......... 428/209

| 2002/0000672 | A1 | 1/2002 | Mori |
| 2002/0008528 | A1 | 1/2002 | Sato et al. |
| 2002/0024110 | A1 | 2/2002 | Iwatsu et al. |
| 2003/0089923 | A1 | 5/2003 | Oida et al. |
| 2003/0216023 | A1 * | 11/2003 | Wark et al. .................. 438/613 |
| 2004/0212969 | A1 | 10/2004 | Imamura et al. |

FOREIGN PATENT DOCUMENTS

| JP | 2002-43376 | 2/2002 |
| JP | 2003-31613 | 1/2003 |
| JP | 2004-327936 | 11/2004 |

* cited by examiner

Primary Examiner—Tu-Tu V Ho

(57) ABSTRACT

A semiconductor device includes a tape carrier substrate having a flexible insulating film base, a plurality of conductor wirings provided on the film base, and wiring bumps respectively formed so as to cover an upper surface and both side surfaces of the conductor wirings, and a semiconductor chip mounted on the tape carrier substrate, wherein electrodes of the semiconductor chip are connected to the conductor wirings via the wiring bumps. Electrode bumps are formed on the electrodes of the semiconductor chip, the electrodes of the semiconductor chip are connected to the conductor wirings via a bonding between the wiring bumps and the electrode bumps, and the electrode bumps are harder than the wiring bumps. This structure can reduce bonding damages to the electrodes of the semiconductor chip caused by a process of connecting the electrodes and the conductor wirings via the bumps.

3 Claims, 10 Drawing Sheets

SEMICONDUCTOR DEVICE AND METHOD FOR PRODUCING THE SAME

CROSS-REFERENCE TO RELATED APPLICATIONS

This application is a continuation of application U.S. Ser. No. 11/405,060, filed Apr. 16, 2006, which application is incorporated herein by reference.

BACKGROUND OF THE INVENTION

1. Field of the Invention

The present invention relates to a semiconductor device in which a semiconductor chip is mounted via protruding electrodes on conductor wirings of a tape carrier substrate used for a Bump On Film (BOF) or the like, and a method for producing the same.

2. Description of Related Art

In a package such as a BOF (Bump On Film) used for a liquid crystal driver, a tape-shaped base formed of polyimide or the like is used as a wiring board on which a semiconductor chip is to be mounted. FIG. 9 is a sectional view showing a part of an exemplary BOF. The BOF has a structure in which a semiconductor chip 22 is mounted on a flexible tape carrier substrate 21 and protected with a sealing resin 23, and is used mainly as a driver for driving a flat panel display. The tape carrier substrate 21 mainly includes a flexible insulating film base 24, conductor wirings 25 formed on the surface of the film base 24 and bumps 26 formed on the conductor wirings 25. A metal plating film and a layer of solder resist, which is an insulating resin, are formed on the conductor wirings 25 as needed. The bumps 26 are disposed at positions corresponding to electrodes 27 of the semiconductor chip 22, and the conductor wirings 25 on the tape carrier substrate 21 and the electrodes 27 on the semiconductor chip 22 are connected via the bumps 26.

In general, polyimide is used for the film base 24, and copper is used for the conductor wirings 25. The bumps 26 are formed on the conductor wirings 25 in advance. The structure of the tape carrier substrate 21 is shown in FIG. 10, which is a perspective view showing a part of the tape carrier substrate 21. As shown in FIG. 10, a plurality of the conductor wirings 25 are aligned on the film base 24, and the bumps 26 are formed on the conductor wirings 25, respectively. The bumps 26 extend laterally across the conductor wiring 25 and extend to regions on both sides of the conductor wiring 25.

In order to form the bumps 26 on the conductor wirings 25 of the tape carrier substrate 21, a method described in JP 2004-327936 A is used, for example. The processes of this method for producing a tape carrier substrate will be described, with reference to FIG. 11.

FIGS. 11(a1) to 11(f1) are plan views showing a part of a film base in a production process in a conventional example. FIGS. 11(a2) to 11(f2) are sectional views corresponding to FIGS. 11(a1) to 11(f1), respectively. Each of these sectional views is taken along a line A-A' in FIG. 11(a1). This production process is an exemplary case of forming protruding electrodes by metal plating.

First, as shown in FIG. 11(a1), a film base 24 with a surface on which a plurality of conductor wirings 25 are aligned is prepared. As shown in FIG. 11(b1), a photoresist 28 is formed on the entire surface of this film base 24. Next, as shown in FIG. 1(c1), an exposure mask 29 for forming bumps is opposed to an upper part of the photoresist 28 formed on the film base 24. A light-transmitting region 29a of the exposure mask 29 has an elongated opening shape that continues so as to cross the plurality of conductor wirings 25 along the alignment direction of the plurality of conductor wirings 25. By light exposure through the light-transmitting region 29a of the exposure mask 29 followed by development, as shown in FIG. 11(d1), an opening of an elongated pattern 28a crossing the conductor wirings 25 is formed in the photoresist 28. This exposes a part of the conductor wirings 25 in the elongated pattern 28a. Subsequently, the exposed part of the conductor wirings 25 is plated with metal through the elongated pattern 28a of the photoresist 28, whereby bumps 26 are formed as shown in FIG. 11(e1). Thereafter, the photoresist 28 is removed, thus obtaining a tape carrier substrate 21 in which the bumps 26 are formed on the conductor wirings 25 as shown in FIG. 11(f1).

As described above, by plating the exposed part of the conductor wirings 25 with the metal through the elongated pattern 28a formed in the photoresist 28, the bumps 26 with the shape illustrated in FIG. 10 can be formed easily. This is because, in the process shown in FIG. 11(e1), not only the upper surface of the conductor wiring 25 but also side surfaces thereof are exposed, and the entire exposed surfaces of the conductor wiring 25 are plated.

In the case where the bumps 26 are formed of copper, the metal plating can be, for example, electroplating at 0.3 to 5 A/dm$^2$ using copper sulfate as a plating solution.

When mounting a semiconductor chip 22 on the tape carrier substrate 21 on which the plurality of conductor wirings 25 are aligned as described above, the bonding process as shown in FIG. 12 is carried out. First, as shown in FIG. 12A, the semiconductor chip 22 and the tape carrier substrate 21 are opposed to each other. At this time, a sealing resin 23 is applied onto the tape carrier substrate 21 in advance, and then the positioning between electrodes 27 and the bumps 26 is conducted. Next, the bonding process as shown in FIG. 12B is carried out for the semiconductor chip 22 and the tape carrier substrate 21 that have been subjected to the positioning. In other words, a bonding tool (not shown) is made to contact the back surface of the semiconductor chip 22 so as to apply a load and ultrasonic vibrations, thereby bonding the electrodes 27 and the bumps 26.

However, in such a bonding technique, the ultrasonic vibrations are applied to the semiconductor chip 22, so that damage such as cracking occurs below the electrodes 27 of the semiconductor chip 22.

SUMMARY OF THE INVENTION

It is an object of the present invention to solve the problem described above and to provide a semiconductor device having a structure that reduces bonding damage at electrodes of a semiconductor chip caused by a process of bonding the electrodes of the semiconductor chip and conductor wirings via bumps.

A semiconductor device with a first configuration according to the present invention includes a tape carrier substrate including a flexible insulating film base, a plurality of conductor wirings provided on the film base, and wiring bumps respectively formed so as to cover an upper surface and both side surfaces of the conductor wirings; and a semiconductor chip mounted on the tape carrier substrate; wherein electrodes of the semiconductor chip are connected to the conductor wirings via the wiring bumps. In order to solve the problem described above, electrode bumps are formed on the electrodes of the semiconductor chip, the electrodes of the semiconductor chip are connected to the conductor wirings via a bonding between the wiring bumps and the electrode bumps, and the electrode bumps are harder than the wiring bumps.

A semiconductor device with a second configuration according to the present invention includes a tape carrier substrate including a flexible insulating film base, a plurality of conductor wirings provided on the film base, and wiring bumps respectively formed on the conductor wirings; and a semiconductor chip mounted on the tape carrier substrate; wherein electrodes of the semiconductor chip are connected to the conductor wirings via the wiring bumps. In order to solve the problem described above, electrode bumps are formed on the electrodes of the semiconductor chip, the electrodes of the semiconductor chip are connected to the conductor wirings via a bonding between the wiring bumps and the electrode bumps, and the wiring bumps are harder than the electrode bumps.

A method for producing a semiconductor device according to the present invention includes mounting a semiconductor chip on a tape carrier substrate having a flexible insulating film base, a plurality of conductor wirings provided on the film base, and wiring bumps respectively formed on the conductor wirings; and bonding electrode bumps formed on electrodes of the semiconductor chip and the wiring bumps so as to connect the electrodes of the semiconductor chip and the conductor wirings. In order to solve the problem described above, the method includes forming one of the electrode bump and the wiring bump with a material harder than a material of the other, conducting positioning between the semiconductor chip and the tape carrier substrate such that the electrode bumps and the wiring bumps are opposed to each other, bonding the electrode bumps and the wiring bumps, and inspecting a bonding displacement between the wiring bumps and the electrode bumps by an observation from a side of the tape carrier substrate, on which the semiconductor chip is not mounted, through the tape carrier substrate.

DETAILED DESCRIPTION OF THE INVENTION

With the above-described configuration of the semiconductor device according to the present invention, ultrasonic vibrations applied at the time of bonding electrodes of a semiconductor chip and conductor wirings are distributed via electrode bumps and wiring bumps, so that load on the electrodes can be reduced. Consequently, damage to the electrodes is reduced, thereby making it possible to improve the reliability.

In the above-described semiconductor device with the first configuration, the electrode bumps can include a Ni layer and an Au layer that are layered sequentially.

Also, the electrode bumps can be smaller than the wiring bumps and buried in the wiring bumps.

Alternatively, the electrode bumps can be at least as large as the wiring bumps, and the wiring bumps can be deformed.

In the above-described semiconductor device with the second configuration, the wiring bumps can include a Ni layer and an Au layer that are layered sequentially.

Also, the wiring bumps can be formed so as to cover an upper surface and both side surfaces of the conductor wirings of the tape carrier substrate.

Alternatively, the wiring bumps can be formed so as to cover only an upper surface or only an upper surface and one of both side surfaces of the conductor wirings of the tape carrier substrate.

Moreover, the wiring bumps can be smaller than the electrode bumps and buried in the electrode bumps.

The following is a description of embodiments of the present invention, with reference to the accompanying drawings.

Embodiment 1

Figure 1:
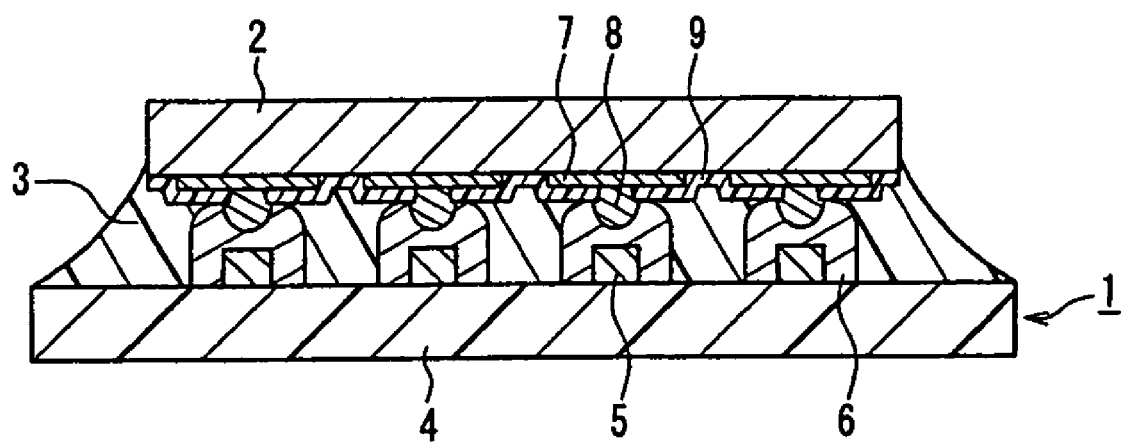
FIG. 1 is a sectional view showing a semiconductor device according to Embodiment 1 of the present invention.

FIG. 1 is a sectional view showing a semiconductor device according to Embodiment 1 of the present invention. It should be noted that the same elements as those in the conventional example are assigned the same numerals, and descriptions thereof will not be repeated.

As shown in FIG. 1, a semiconductor chip 2 is mounted on a tape carrier substrate 1, and they are fixed with a sealing resin 3 that is filled therebetween. The tape carrier substrate 1 has a flexible insulating film base 4, conductor wirings 5 formed on the surface of the film base 4 and wiring bumps 6 formed on the conductor wirings 5. The wiring bump 6 may be formed so as to cover an upper surface and both side surfaces of the conductor wiring 5. The semiconductor chip 2 has electrodes 7, electrode bumps 8 formed on the electrodes 7 and a protective film 9 with which the electrode 7 around the electrode bump 8 is coated.

The electrodes 7 of the semiconductor chip 2 mounted on the tape carrier substrate 1 are connected to the conductor wirings 5 of the tape carrier substrate 1 via the electrode bumps 8 and the wiring bumps 6. The electrode bumps 8 may be smaller than the wiring bumps 6, and bonded to the wiring bumps in such a manner as to be buried in the wiring bumps 6.

In the configuration described above, a material of the electrode bumps 8 is harder than that of the wiring bumps 6. Therefore, the wiring bumps 6 deform at the time of bonding, so that stress on the semiconductor chip 2 is alleviated. Further, since the electrode bumps 8 have a high hardness and do not deform due to the bonding, a bonding load is applied uniformly to the electrodes 7, thus reducing damage to the semiconductor chip 2.

Moreover, because of a large amount of deformation in the surface of the wiring bumps 6, it also is possible to obtain an effect in which an insulating film at the surface of the wiring bumps, which may cause a poor bonding, breaks so as to achieve an excellent bonding. Furthermore, since the electrode bumps 8 are buried in the wiring bumps 6, a sufficient bonding stability can be obtained even when the tape carrier substrate 1 expands or shrinks due to heat. In order to ensure such effects, it is effective that the wiring bumps 6 are larger than the electrode bumps 8, and it is desired that the former should be at least twice as large as the latter.

The material of the wiring bumps 6 mainly is Au/Cu or Au/Ni/Cu formed, in general, by electroplating. The material of the electrode bumps 8 generally is Au/Ni formed by electroless plating, and may be any metal that can be formed by electroless plating. Thus, metals such as Pd, Pt and Cu can be considered. With regard to the relationship of bump hardness, it is appropriate that the wiring bumps have a hardness of equal to or lower than 100 (Hv) and the electrode bumps have a hardness of equal to or higher than 400 (Hv) according to Vickers hardness (Hv). It is preferable that the electrode bumps 8 are at least five times as hard as the wiring bumps 6.

Figure 2A:
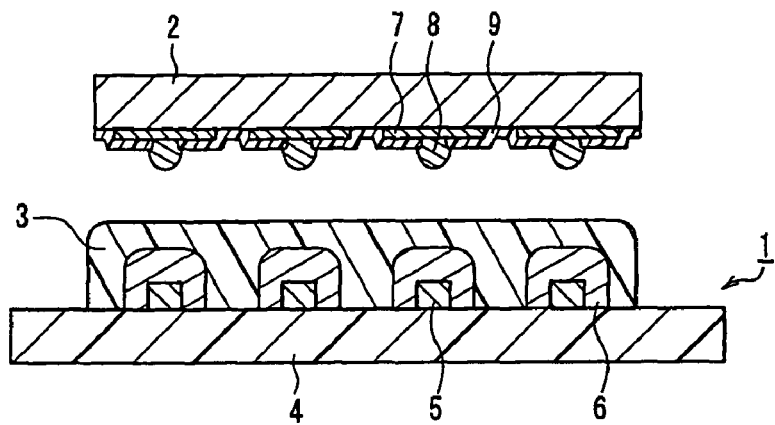
FIG. 2 is a sectional view showing a part of a process of producing the semiconductor device shown in FIG. 1.

FIG. 2 is a sectional view showing a part of a process of producing the semiconductor device with the above-described configuration. First, as shown in FIG. 2A, the semiconductor chip 2 and the tape carrier substrate 1 are opposed to each other. At this time, the sealing resin 3 is applied onto the tape carrier substrate 1 in advance, and then the positioning between the electrode bumps 8 and the wiring bumps 6 is conducted. This positioning generally is conducted utilizing alignment marks (not shown) on the semiconductor chip 2 and alignment marks (not shown) on the tape carrier substrate 1.

Figure 2B:
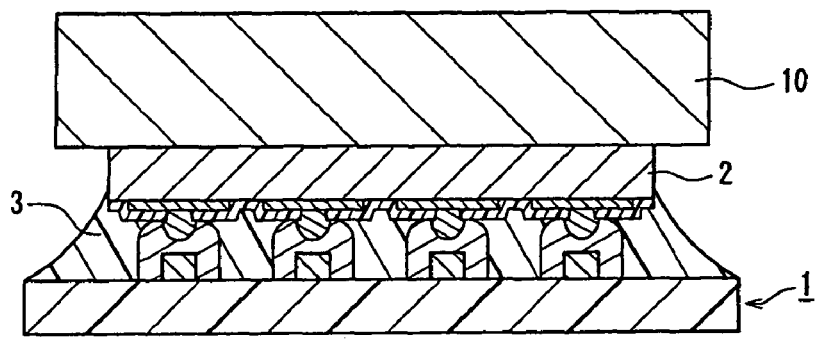

Next, the bonding process as shown in FIG. 2B is carried out for the semiconductor chip 2 and the tape carrier substrate 1 that have been subjected to the positioning. In other words, a bonding tool 10 is made to contact a back surface of the semiconductor chip 2 so as to increase a load on the back surface of the semiconductor chip 2 from the bonding tool 10 and apply ultrasonic vibrations, thereby bonding the electrode bumps 8 and the wiring bumps 6.

Figure 2C:
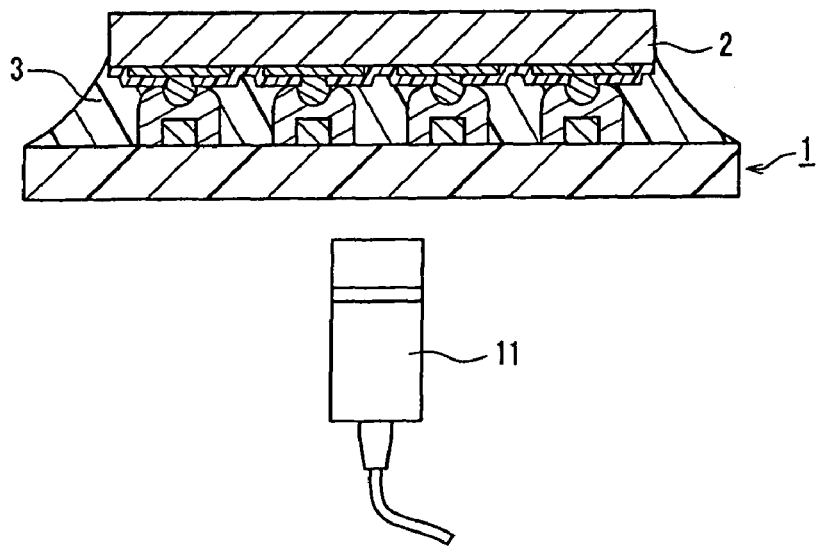
Figure 3A:
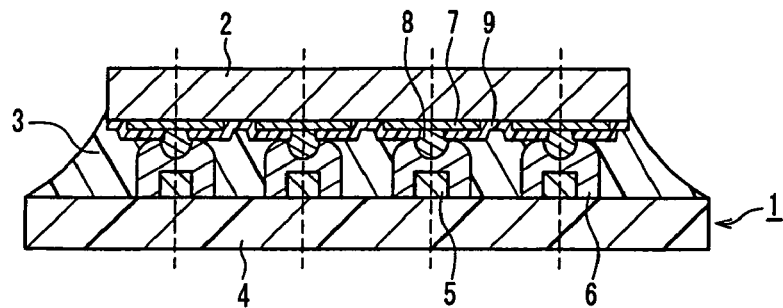
FIG. 3 is a sectional view showing an exemplary criterion in an inspection included in the process shown in FIG. 2.
Figure 3B:
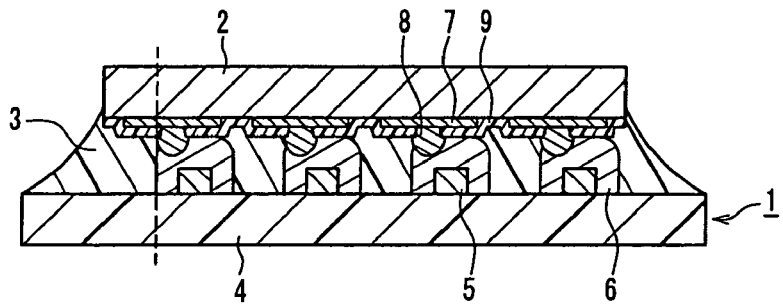
Figure 3C:
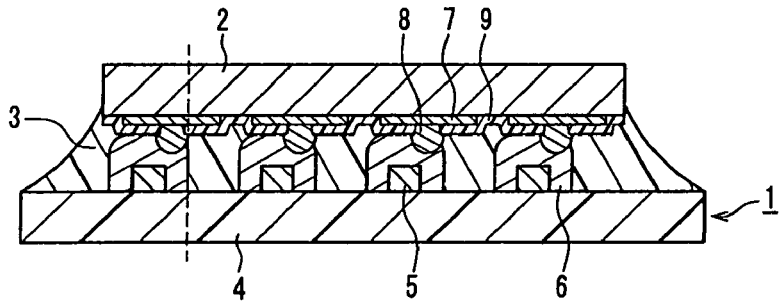
Figure 3D:
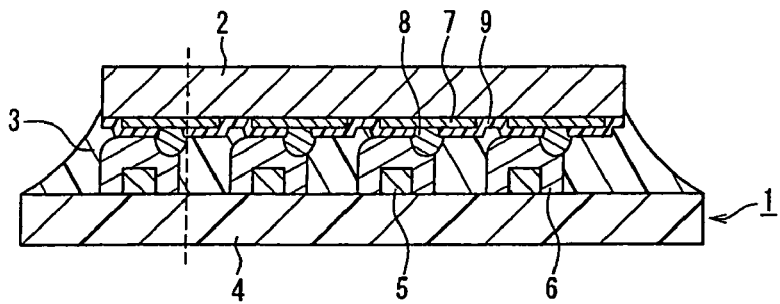

Then, as shown in FIG. 2C, a process of checking a bonding state of the bumps is carried out. Since the tape carrier substrate 1 is formed of an optically transparent material, the bonding state such as a displacement state can be checked with an inspection camera 11 through the tape carrier substrate 1. FIG. 3 shows images of various bonding states with different displacement amounts between the wiring bumps 6 and the electrode bumps 8 checked with the inspection camera 11. FIGS. 3A to 3C show normal bonding states. FIG. 3D shows a state of abnormal bonding. At this time, a protruding amount (ratio) of the electrode bump 8 with respect to the width of the wiring bump 6, for example, serves as a criterion. This is because, as long as the electrode bump 8 is hidden in the wiring bump 6, the entire electrode bump 8 always is in contact with the wiring bump 6, so that the connection strength and the connection resistance are considered to be uniform.

Figure 4:
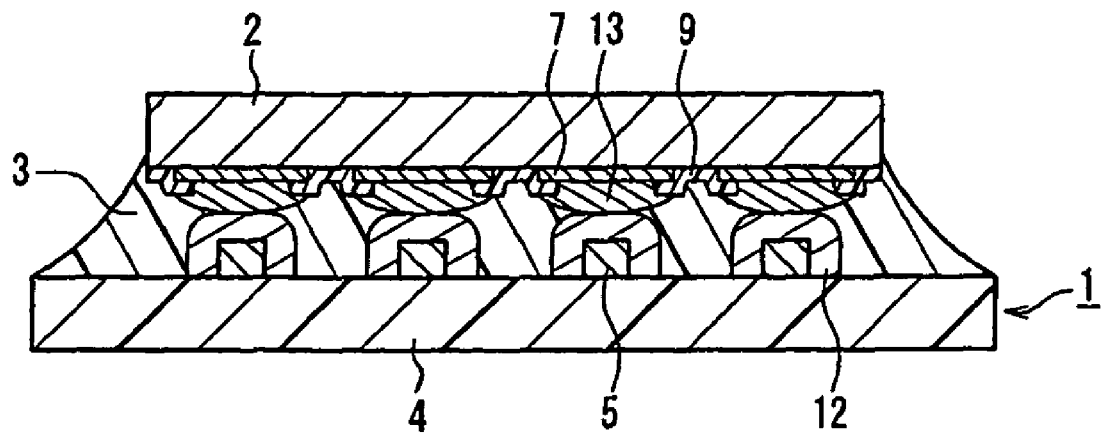
FIG. 4 is a sectional view showing another example of the semiconductor device according to Embodiment 1 of the present invention.

The semiconductor device according to the present embodiment also may be constituted as shown in FIG. 4. Elements similar to those in the semiconductor device shown in FIG. 1 are assigned the same numerals, and descriptions thereof will not be repeated.

In this semiconductor device, electrode bumps 13 have a size equal to wiring bumps 12 (the figure shows the case where they have equal sizes). In this case, since the electrode bumps 13 also are harder than the wiring bumps 12, the wiring bumps 12 deform due to the bonding, but the electrode bumps 13 are not buried in the wiring bumps 12. Because of the deformation of the wiring bumps 12, an insulating film at the surface of the wiring bumps, which may cause a poor bonding, breaks and a contact area increases, thereby achieving an excellent bonding.

Furthermore, since the electrode bumps 13 are at least as large as the wiring bumps 12, the load on the parts below the electrodes 7 of the semiconductor chip 2 is distributed to the entire electrodes 7 via the electrode bumps 13 even when the bonding load of the wiring bumps 12 increases. As a result, damage to the parts below the electrodes 7 and the protective film 9 is reduced.

In this case, the relationship of bump hardness also is appropriate if the wiring bumps 12 have a hardness of equal to or lower than 100 (Hv) and the electrode bumps 13 have a hardness of equal to or higher than 400 (Hv) according to Vickers hardness. It is preferable that the electrode bumps 13 are at least five times as hard as the wiring bumps 12.

As exemplary materials of the bumps, it is appropriate that Au/Ni formed by electroless plating is used for the electrode bumps 13 and Au/Cu or Au is used for the wiring bumps 12.

Embodiment 2

Figure 5:
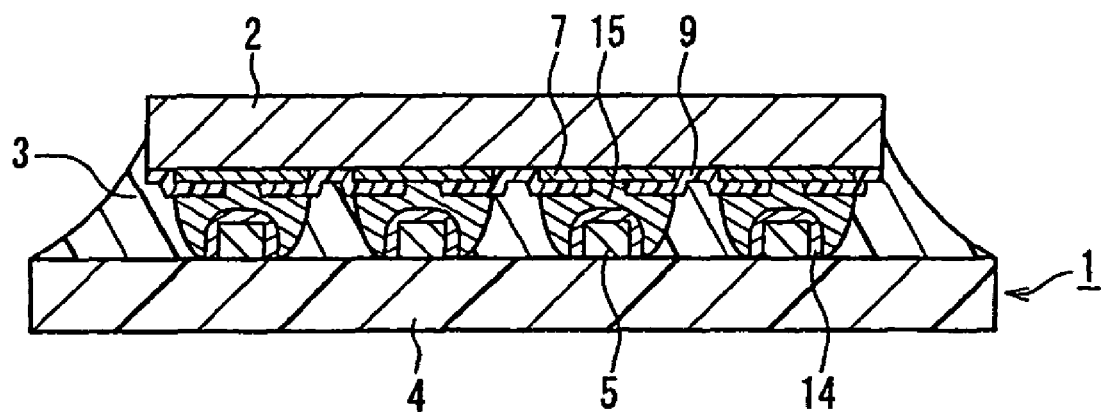
FIG. 5 is a sectional view showing a semiconductor device according to Embodiment 2 of the present invention.

FIG. 5 is a sectional view showing a semiconductor device according to Embodiment 2 of the present invention. Elements similar to those in Embodiment 1 are assigned the same numerals, and descriptions thereof will not be repeated.

In the present embodiment, conductor wirings 5 and electrodes 7 are bonded such that a wiring bump 14 formed so as to cover an upper surface and both side surfaces of the conductor wiring 5 on a tape carrier substrate 1 is buried in an electrode bump 15 formed on the electrode 7 of a semiconductor chip 2. A material of the wiring bumps 14 is harder than that of the electrode bumps 15. Therefore, the electrode bumps 15 deform at the time of bonding, so that stress on the semiconductor chip 2 is alleviated. Further, since the electrode bumps 15 have a low hardness and deform at the time of the bonding, a bonding load is applied uniformly to the electrodes 7, thus reducing damage to the semiconductor chip 2.

Moreover, because of a large amount of deformation in the surface of the electrode bumps 15, an insulating film at the surface of the wiring bumps, which may cause a poor bonding, breaks so as to achieve an excellent bonding. Furthermore, since the wiring bumps 14 are buried in the electrode bumps 15, a sufficient bonding stability can be obtained even when the tape carrier substrate 1 expands or shrinks due to heat. In order to achieve such effects, it is effective that the electrode bumps 15 are larger than the wiring bumps 14, and it is desired that the former should be at least twice as large as the latter.

The material of the wiring bumps 14 mainly is metal such as Pd or Pt, or Au/Ni because the wiring bumps 14 generally are formed by electroplating. The material of the electrode bumps 15 generally is SnAg, SnPb, SnCu or SnZn solder, Au/Cu plating or SnAgCu solder balls formed by electroplating. Also, when using the solder material, it may be appropriate to form bumps by electroplating and then forming them into spherical bumps by reflowing. With regard to the relationship of bump hardness, it is appropriate that the wiring bumps 14 are at least five times as hard as the electrode bumps 15 according to Vickers hardness. It is most preferable that the wiring bumps 14 have a hardness of equal to or higher than 400 (Hv) and the electrode bumps 15 have a hardness of equal to or lower than 100 (Hv).

Figure 6A:
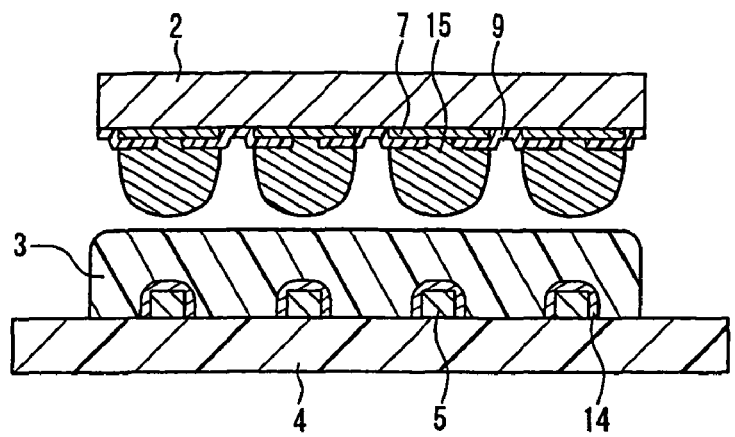
FIG. 6 is a sectional view showing a part of a process of producing the semiconductor device shown in FIG. 5.

FIG. 6 is a sectional view showing a part of a process of producing the semiconductor device with the above-described configuration. As shown in FIG. 6A, the semiconductor chip 2 and the tape carrier substrate 1 are opposed to each other. At this time, the sealing resin 3 is applied onto the tape carrier substrate 1 in advances and the positioning between the electrode bumps 15 and the wiring bumps 14 is conducted. This positioning generally is conducted utilizing alignment marks (not shown) on the semiconductor chip 2 and alignment marks (not shown) on the tape carrier substrate 1.

Figure 6B:
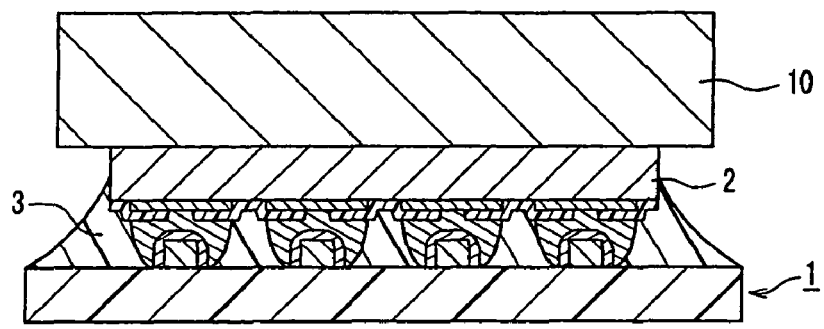

Next, the bonding process as shown in FIG. 6B is carried out for the semiconductor chip 2 and the tape carrier substrate 1 that have been subjected to the positioning. In other words, a bonding tool 10 is made to contact a back surface of the semiconductor chip 2 so as to increase a load on the back surface of the semiconductor chip 2 from the bonding tool 10, thereby bonding the electrode bumps 15 and the wiring bumps 14. At the time of bonding, ultrasonic vibrations are applied by the bonding tool 10.

Figure 6C:
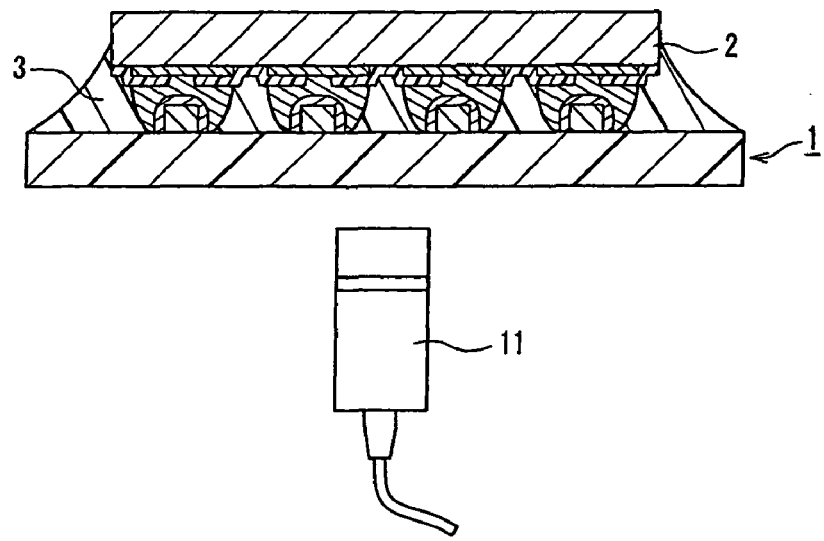
Figure 7A:
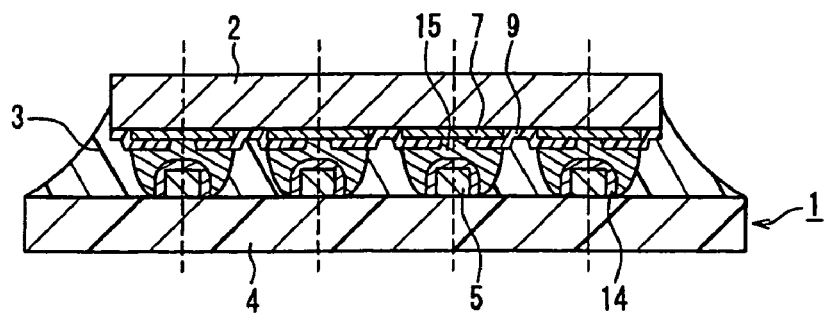
FIG. 7 is a sectional view showing an exemplary criterion in an inspection included in the process shown in FIG. 6.
Figure 7B:
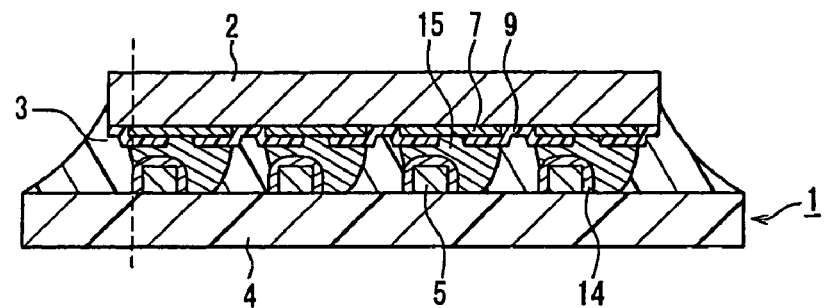
Figure 7C:
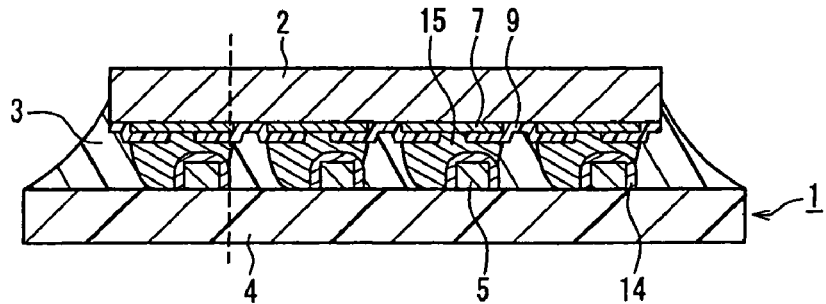
Figure 7D:
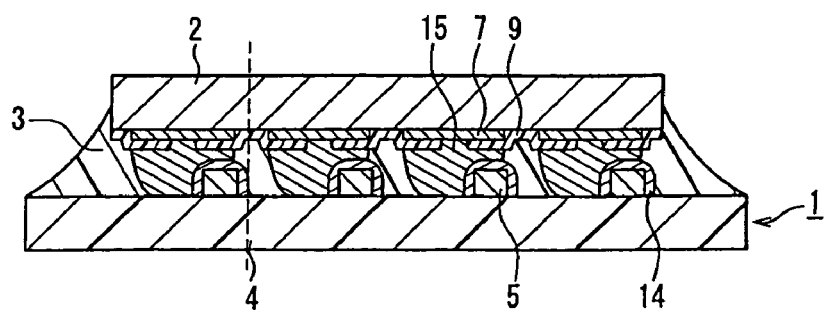
Figure 8A:
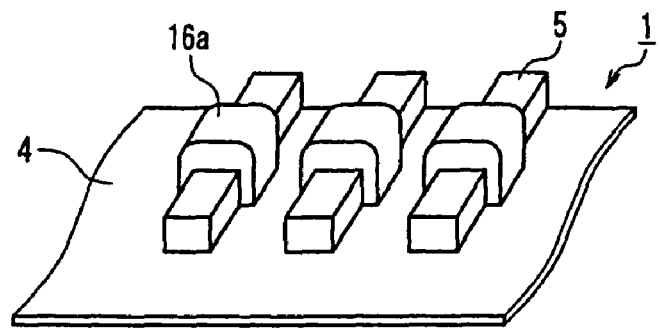
FIG. 8 is a perspective view showing a structure of a tape carrier substrate in an embodiment of the present invention.
Figure 8B:
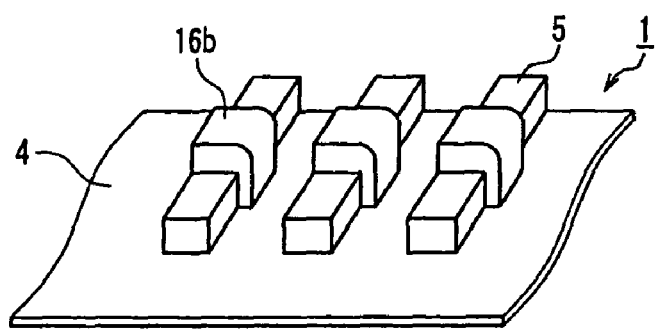
Figure 8C:
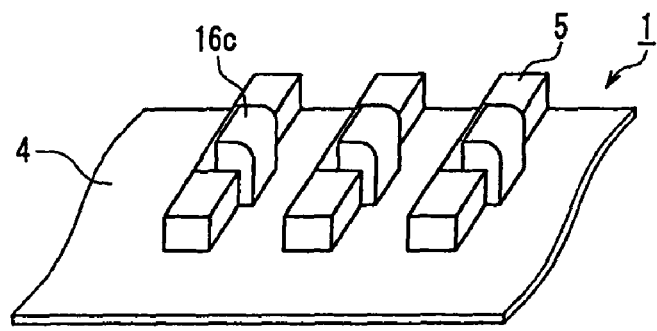
Figure 8D:
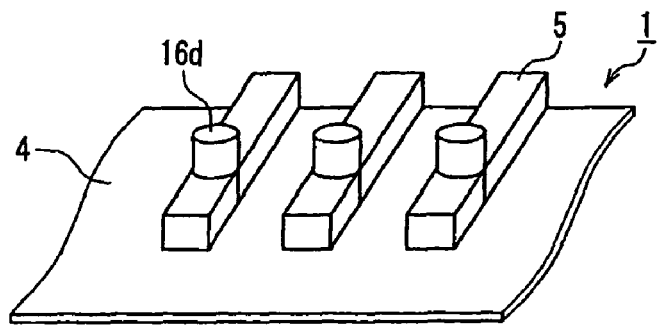
Figure 9:
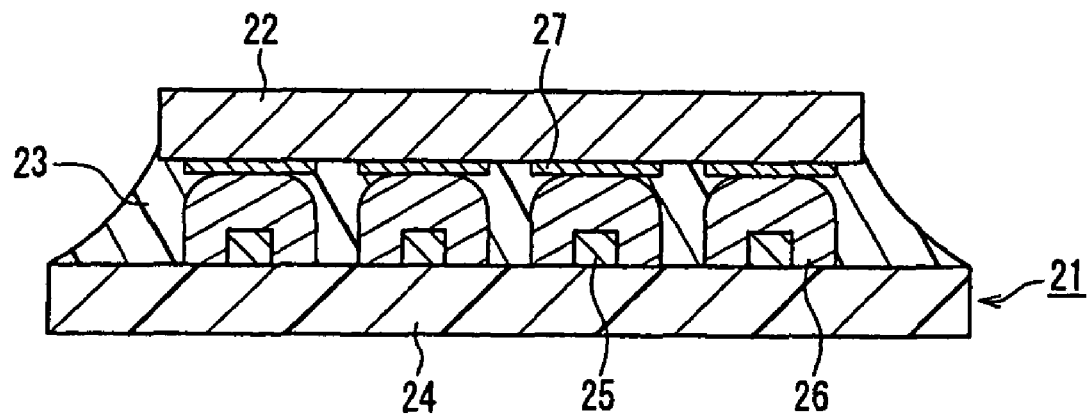
FIG. 9 is a sectional view showing a semiconductor device in a conventional example.
Figure 10:
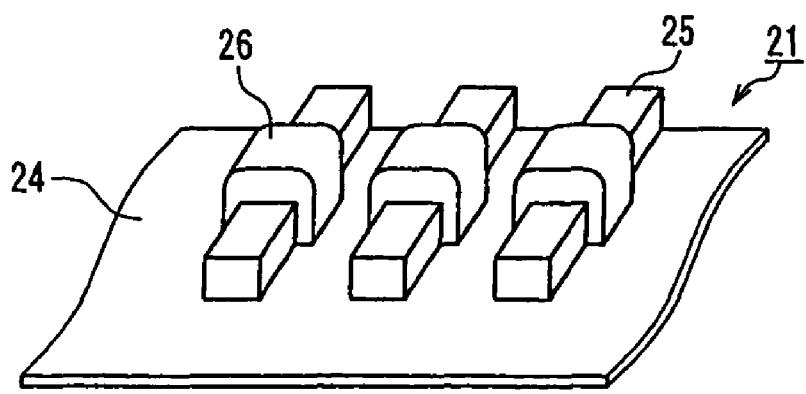
FIG. 10 is a perspective view showing a structure of a tape carrier substrate used in the semiconductor device shown in FIG. 9.
Figure 11:
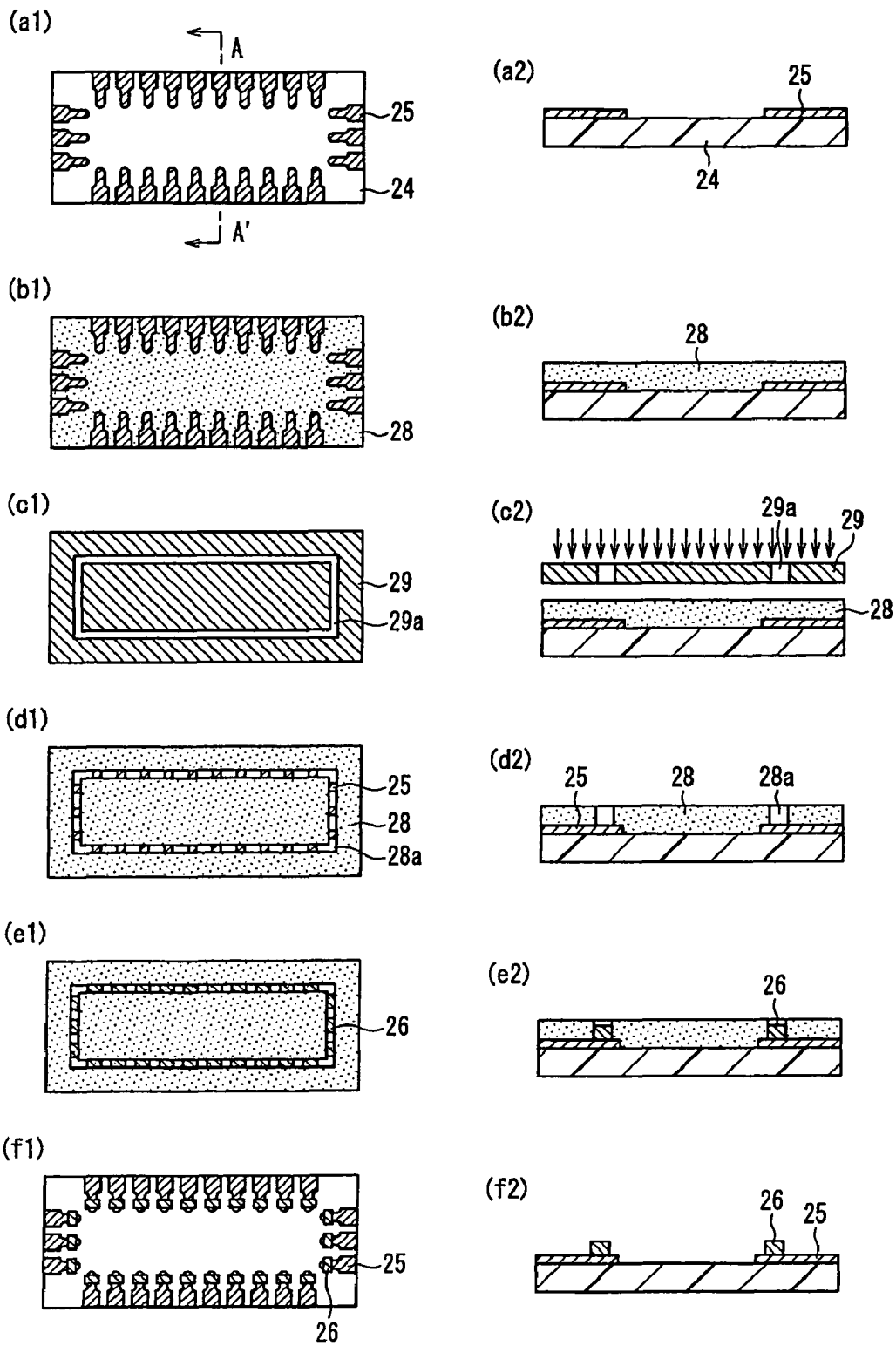
FIGS. 11(a1) to 11(f1) are plan views showing a process of producing the tape carrier substrate in the conventional example, and FIGS. 11(a2) to 11(f2) are sectional views corresponding to FIGS. 11(a1) to 11(f1), respectively.
Figure 12A:
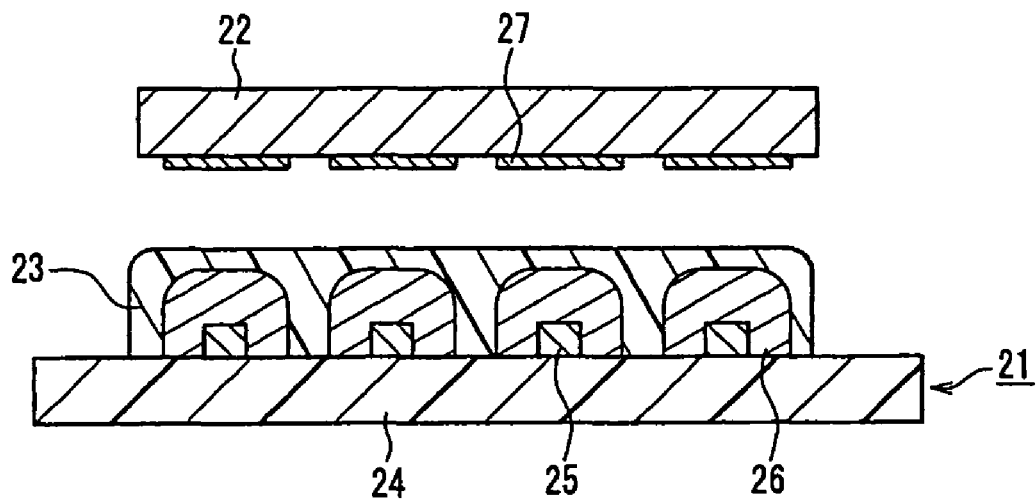
FIG. 12 is a sectional view showing a part of a process of producing the semiconductor device shown in FIG. 9.
Figure 12B:
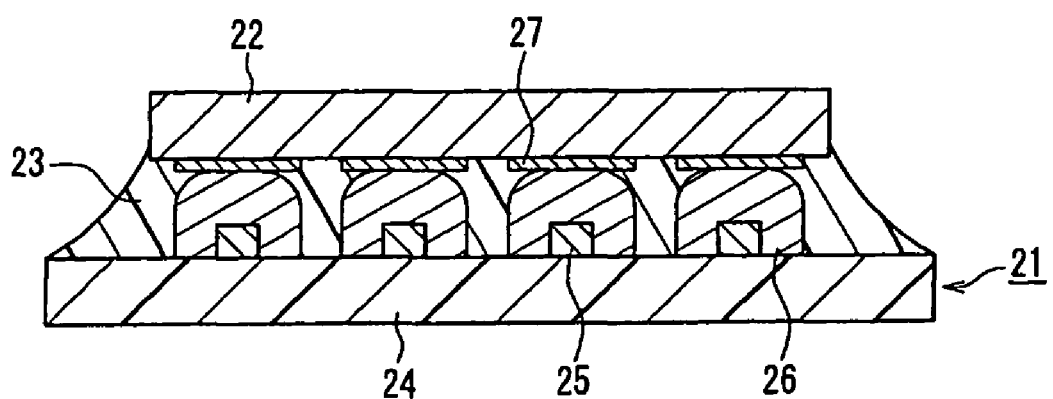

Then, as shown in FIG. 6C, a process of checking a bonding state of the bumps is carried out. Since the tape carrier substrate 1 is formed of an optically transparent material, the bonding state such as a displacement state can be checked with an inspection camera 11 through the tape carrier substrate 1. FIG. 7 shows images of states checked with the inspection camera 11. FIGS. 7A to 7C show normal bonding states. FIG. 7D shows a state of abnormal bonding. At this time, a protruding amount (ratio) of the wiring bump 14 with respect to the width of the electrode bump 15, for example, serves as a criterion. This is because, as long as the wiring bump 14 is hidden in the electrode bump 15, the entire wiring bump 14 always is in contact with the electrode bump 15, so that the connection strength and the connection resistance are considered to be uniform.

FIG. 8 illustrates various exemplary shapes of wiring bumps on the conductor wirings 5 in the tape carrier substrate 1 used in the embodiments of the present invention. FIG. 8A shows wiring bumps 16*a* each formed so as to cover an upper surface and both side surfaces of the conductor wiring 5. FIG. 8B shows wiring bumps 16*b* each formed so as to cover the upper surface and one side surface of the conductor wiring 5. FIG. 8C shows wiring bumps 16*c* each formed so as to cover a part of the upper surface and one side surface of the conductor wiring 5. FIG. 8D shows wiring bumps 16*d* that have a circular planar shape and are each formed only on the upper surface of the conductor wiring 5. The planar shape also may be a polygonal shape having three or more vertices.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
    a tape carrier substrate comprising
        a plurality of conductor wirings, and
        wiring bumps respectively formed on the conductor wirings; and
    a semiconductor chip mounted on the tape carrier substrate, with electrodes of the semiconductor chip being connected to the conductor wirings via the wiring bumps,
    wherein electrode bumps with hardness lower than and a size larger than the wiring bumps are formed on the electrodes of the semiconductor chip, so that the electrodes of the semiconductor chip are connected to the conductor wirings via a bonding between the wiring bumps and the electrode bumps,
    the wiring bumps are formed so as to cover an upper surface and both side surfaces of the conductor wirings of the tape carrier substrate,
    the wiring bumps are buried in the electrode bumps, and
    the electrode bumps are in contact with the tape carrier substrate.

2. The semiconductor device according to claim 1, wherein the wiring bumps comprise a Ni layer and an Au layer.

3. The semiconductor device according to claim 1, wherein the wiring bumps are formed so as to cover only an upper surface or only an upper surface and one of both side surfaces of the conductor wirings of the tape carrier substrate.

* * * * *